(12) United States Patent
Straeussnigg et al.

(10) Patent No.: US 12,707,199 B2
(45) Date of Patent: Aug. 11, 2026

(54) FILTERING ARCHITECTURE WITH MINIMIZED TRANSIENTS

(71) Applicant: Infineon Technologies AG, Neubiberg (DE)

(72) Inventors: Dietmar Straeussnigg, Villach (AT); Simon Grünberger, Moosburg (AT); Mario Grgic, Villach (AT)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 18/494,567

(22) Filed: Oct. 25, 2023

(65) Prior Publication Data

US 2025/0142256 A1 May 1, 2025

(51) Int. Cl.

*H04R 3/06* (2006.01)
*H03M 3/00* (2006.01)
*H04R 19/04* (2006.01)

(52) U.S. Cl.

CPC ............... *H04R 3/06* (2013.01); *H04R 19/04* (2013.01); *H03M 3/494* (2013.01); *H04R 2201/003* (2013.01)

(58) Field of Classification Search

CPC . H04R 1/08; H04R 3/06; H04R 19/04; H04R 2201/003; H03M 3/494
USPC .......................................................... 381/98
See application file for complete search history.

(56) References Cited

U.S. PATENT DOCUMENTS

| | | | |
|---|---|---|---|
| 9,282,406 | B2 | 3/2016 | Bogason et al. |
| 9,979,367 | B2 | 5/2018 | Rombach et al. |
| 10,341,770 | B2 | 7/2019 | Baumgarte |
| 10,461,714 | B2 | 10/2019 | Lesso et al. |
| 10,797,715 | B2 | 10/2020 | Straussnigg et al. |
| 11,121,690 | B2 | 9/2021 | Lesso et al. |
| 12,325,627 | B2 | 6/2025 | Straussnigg et al. |
| 12,368,421 | B2 | 7/2025 | Ceballos et al. |
| 2023/0344398 | A1 * | 10/2023 | Ceballos ............. H03G 3/3031 |
| 2025/0094211 | A1 | 3/2025 | Spittle |

* cited by examiner

*Primary Examiner* — Paul Kim
(74) *Attorney, Agent, or Firm* — Slater Matsil, LLP

(57) ABSTRACT

A digital microphone includes a logarithmic amplifier; an analog-to-digital converter (ADC) coupled to the logarithmic amplifier; a digital decompression component coupled to the ADC; and a digital filter coupled to the digital decompression component, wherein the digital filter includes a controlled upsampling component coupled to an input of the digital filter and a controlled downsampling component coupled to an output of the digital filter.

10 Claims, 17 Drawing Sheets

FILTERING ARCHITECTURE WITH MINIMIZED TRANSIENTS

TECHNICAL FIELD

The present invention relates generally to a filtering architecture with minimized transients and a corresponding method.

BACKGROUND

Digital microphones are known in the art. In digital microphones new features like dynamic acoustic overload point (AOP) switching or requirements for increased signal-to-noise ratio (SNR) and reduced power consumption are increasingly demanded by customers. In existing solutions, a tradeoff exists between decompression performance (SNR/leveled noise, total harmonic distortion (THD)) and the presence of audible transients. These transients occur particularly during switching between operating modes of the digital microphone. Some existing solutions apply a stronger low-pass filter (which has a lower cut-off frequency), which leads to better signal reconstruction but at the price of longer audible transients.

SUMMARY

According to an embodiment, a digital microphone comprises a logarithmic amplifier; an analog-to-digital converter (ADC) coupled to the logarithmic amplifier; a digital decompression component coupled to the ADC; and a digital filter coupled to the digital decompression component, wherein the digital filter comprises a controlled upsampling component coupled to an input of the digital filter and a controlled downsampling component coupled to an output of the digital filter.

According to an embodiment, a digital filter system comprises a controlled upsampling component coupled to an input of the digital filter; a digital filter having an input coupled to an output of the controlled upsampling component; a controlled downsampling component coupled to an output of the digital filter; and a controller having a trigger signal input and a first output coupled to a first control input of the controlled upsampling component and coupled to a first control input of the controlled downsampling component.

According to an embodiment, a method comprises in a first mode of operation, upsampling a digital input signal to provide an interpolated digital signal, filtering the interpolated digital signal, and downsampling the interpolated digital signal to provide a digital output signal; and in a second mode of operation, filtering the digital input signal to provide the digital output signal without upsampling or downsampling the digital input signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Figure 1B:
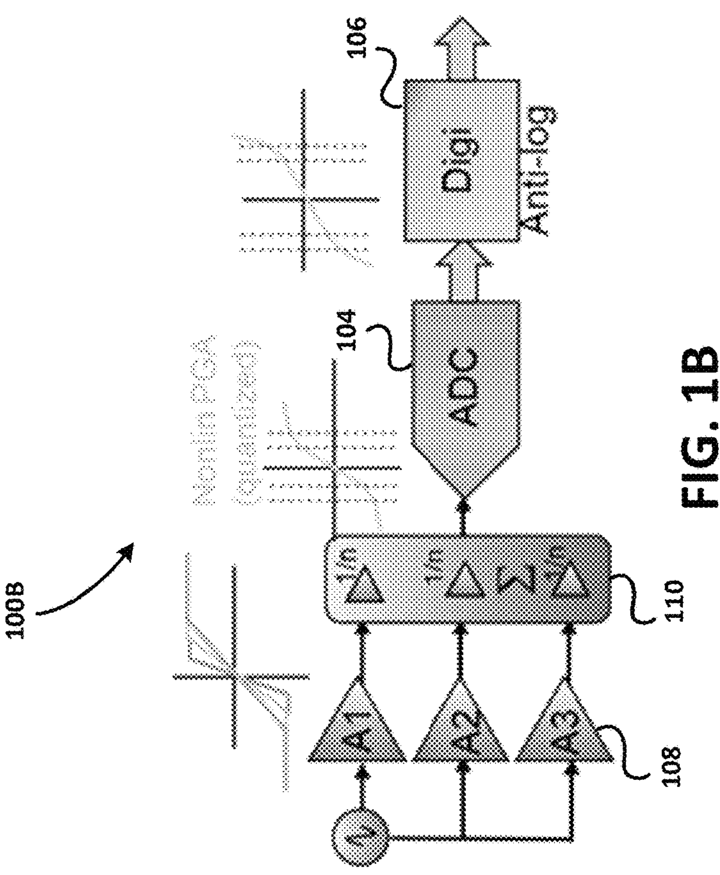
FIG. 1A and FIG. 1B are block diagrams of logarithmic amplifier architectures, according to the prior art.
Figure 1A:
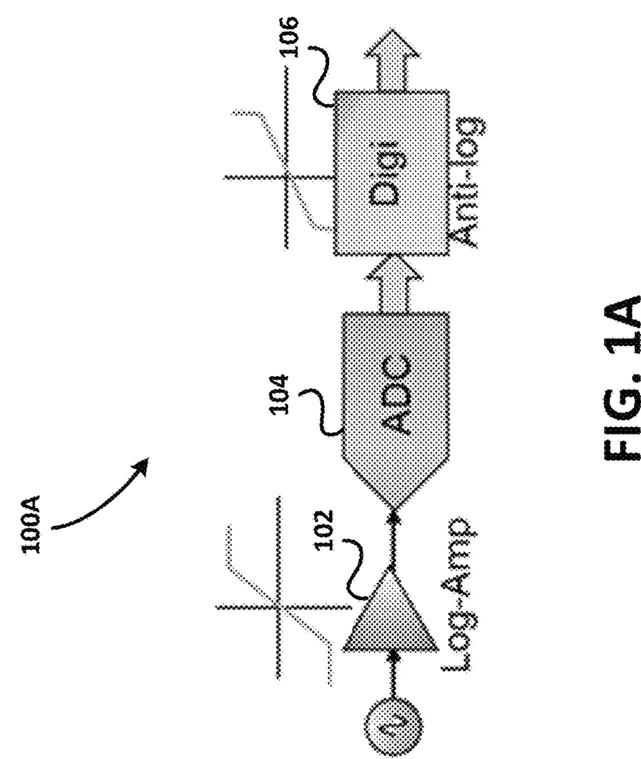

The more demanding specifications for digital microphones have resulted in the introduction of architectures using a logarithmic amplifier as is shown in the logarithmic amplifier architecture 100A of FIG. 1A. In FIG. 1A the analog input signal of the digital microphone is received by a logarithmic amplifier 102. The output signal of logarithmic amplifier 102 is converted to a digital signal by analog-to-digital converter (ADC) 104. The digital signal provided by ADC 104 is then processed by a digital anti-logarithmic component 106. Another logarithmic amplifier architecture 100B is shown in FIG. 1B, wherein the logarithmic amplifier 102 is replaced by a plurality of linear amplifiers 108 and a summing circuit 110. The logarithmic amplifier architecture 100B is shown and described in further detail in co-pending U.S. patent application Ser. No. 17/660,120 entitled "Logarithmic Amplifiers in Silicon Microphones," which is hereby incorporated by reference in its entirety.

In some embodiments described herein, ADC 104 can comprise a sigma delta ADC (sigma-delta converter). According to embodiments described in further detail below, the digital output of ADC 104 is reconstructed as "fast" as possible in the digital domain (e.g. by low-pass filtering with minimized transients) as is depicted in digital microphone 200 shown in block diagram format in FIG. 2.

Digital microphone 200 includes a micro-electro-mechanical systems (MEMS) device 202 for converting sound waves into an analog output signal. In some embodiments, MEMS device 202 comprises a capacitive silicon MEMS device. The analog output signal of MEMS device 202 is converter into a digital signal and digitally processed in application-specific integrated circuit (ASIC) 204. ASIC 204 includes a logarithmic amplifier 208, which can be one of the logarithmic amplifiers shown in FIG. 1A or FIG. 1B in an embodiment. The output of logarithmic amplifier 208 is coupled to the input of ADC 210, which can be a sigma delta ADC in an embodiment. The output of ADC 210 is coupled to the input of digital low pass filter 212. Several embodiments for digital low pass filter 212 are shown and described in detail below, specifically designed to minimize audible transients especially during switching operating modes of digital microphone 200. The output of digital low pass filter 212 is coupled to the input of digital compression component 214. The output of digital compression component 214 is coupled to the input of digital filter 216. In an embodiment, digital filter 216 can be any appropriate filter (e.g. an offset compensation filter). In operation, digital filter 216 is used to compensate an offset. The output of digital filter 216 is coupled to the input of an optional digital modulator 218 that converts the digital signal provided by digital filter 216 into a one-bit output signal on output digital bus 220. Finally, ASIC 204 receives a clock signal at node 206 that is distributed to one or more of the components described above.

Digital microphone 200 can switch operating modes in the case of dynamic AOP switching. During switching a "step" may occur in the signal chain if switching is not done during a zero crossing. This "step" generates a transient in the digital filter chain, which reduces performance (e.g. audible artefacts). Digital low pass filter 212 is designed to address and reduce the impact of these audible artefacts in various embodiments that are described below.

Figure 2:
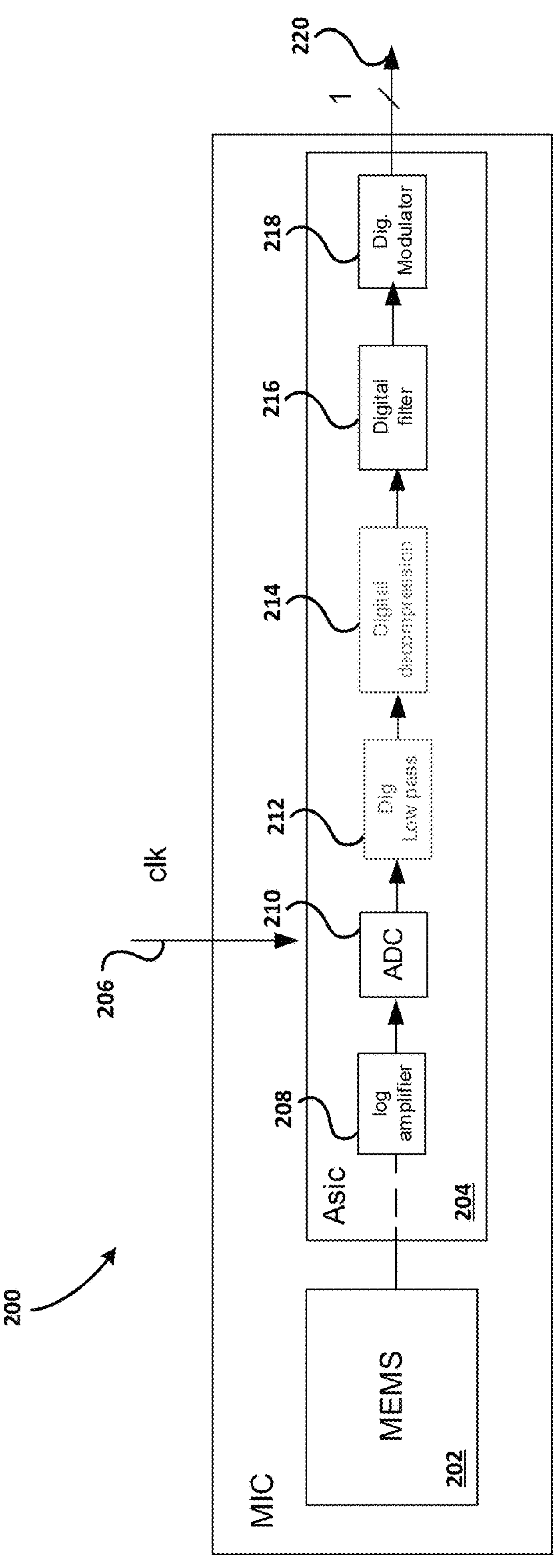
FIG. 2 is a block diagram of an exemplary digital microphone including compression and decompression.
Figure 3:
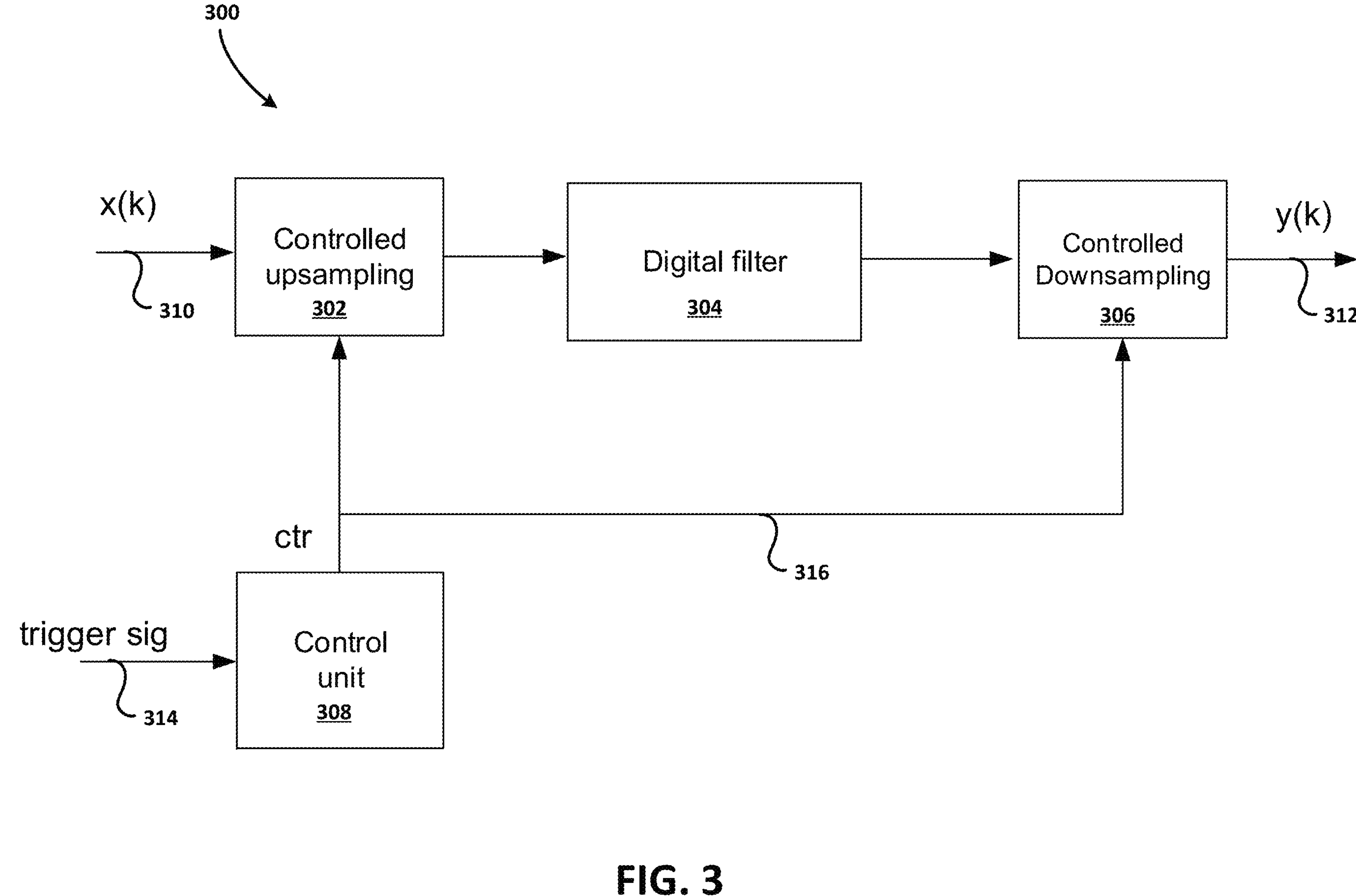
FIG. 3 is a high level block diagram of a digital filter with transient reduction suitable for use in the digital microphone of FIG. 2, according to an embodiment.

FIG. 3 is a high level block diagram of a digital filter system 300 with transient reduction suitable for use in the digital microphone 200 of FIG. 2, according to an embodiment. Digital filter system 300 includes an input x(k) at node 310, a controlled upsampling component 302, a digital filter 304, which can comprise a digital low pass filter, a controlled downsampling component 306, and an output y(k) at node 312. Digital filter system 300 also includes a control unit 308 for receiving a trigger signal at node 314 and for generating a control signal ("ctr") at node 316. When the trigger signal at node 314 is switched, the digital filter system 300 is fed with interpolated samples from controlled upsampling component 302 and the cut-off frequency of digital filter 304 is changed implicitly. Synchronous to the interpolation, the output signal of the digital filter 304 is decimated by controlled downsampling component 306. Generally, the length of the transient is defined by the impulse response of digital filter 304. For example, if the length of the digital filter is "N" samples, the length of the transient is also a maximal length of "N" samples. According to embodiments, the digital microphone 200 exhibits reduced audible transient, since digital filter 304 is filled "faster" with interpolated samples. After the filter "filling", the control unit 308 is switched back to a "normal" operation mode, wherein digital filter 304 is filled with un-interpolated samples at the normal sampling rate. In other words, according to embodiments, the interpolation (and decimation) of digital filter system 300 is enabled until "N" samples are applied to the digital filter 304 and then switched back to a normal mode of operation, wherein the interpolation (and decimation) is disabled.

In an embodiment, digital filter system 300 includes a topology wherein the input of controlled upsampling component 302 is node 310 for receiving the x(k) digital input signal. The output of controlled upsampling component 302 is coupled to the input of digital filter 304. The output of digital filter 304 is coupled to the input of controlled downsampling component 306. The output of controlled downsampling component 306 is node 312 for providing the digital output signal y(k). The input of control unit 308 is node 314 for receiving the trigger signal and an output for providing the control signal ("ctr") for controlling the selective interpolation and decimation of the input signal samples. An example topology is shown in FIG. 3. Other topologies can be used for providing the selective interpolation and decimation associated with digital filter 304.

Figure 4:
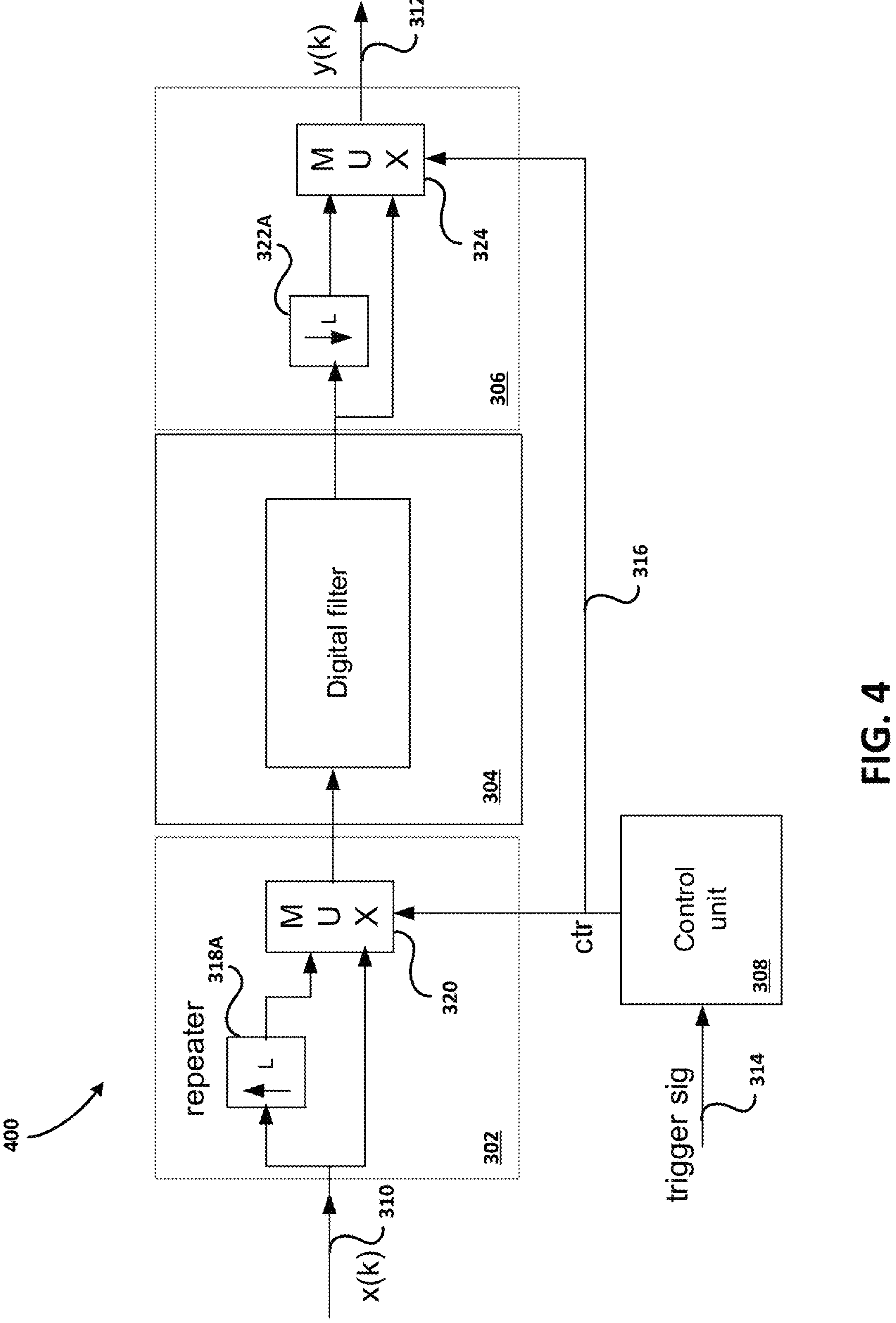
FIG. 4, FIG. 5, and FIG. 6 are more detailed block diagrams of a digital filter with transient reduction circuitry suitable for use in the digital microphone of FIG. 2, according to embodiments.

In FIG. 4 an efficient implementation of digital filter system 400 is shown. The interpolation is implemented with a repeater and a multiplexer, and then the output signal of the digital filter 304 is downsampled (without an additional filter).

In FIG. 4, controlled upsampling component 302 includes a repeater 318A having an output coupled to a first input of multiplexer 320. Multiplexer 320 includes a control input for receiving the "ctr" control signal. The second input of multiplexer 320 is coupled to the input of the controlled upsampling component 302. Repeater 318A has a constant upsampling rate set by an integer "L" designating the number of additional samples that are added in the interpolation. For example, L=2 means that each incoming sample is repeated once, and L=3 means that each incoming sample is repeated twice. In the embodiment of FIG. 4, integer "L" is constant during the mode of operation wherein the interpolation and decimation is used.

In FIG. 4, controlled downsampling component 306 includes a decimation component 322A having an output coupled to a first input of multiplexer 324. Multiplexer 324 includes a control input for receiving the "ctr" control signal. The second input of multiplexer 320 is coupled to the input of the controlled downsampling component 306. Decimation 322A has a constant downsampling rate also set by the integer "L" in this case designating the number of additional samples that are removed in the decimation. For example, L=2 means that one of the two repeated samples is removed during the decimation, and L=3 means that two of the three repeated samples is removed during the decimation.

Figure 5:
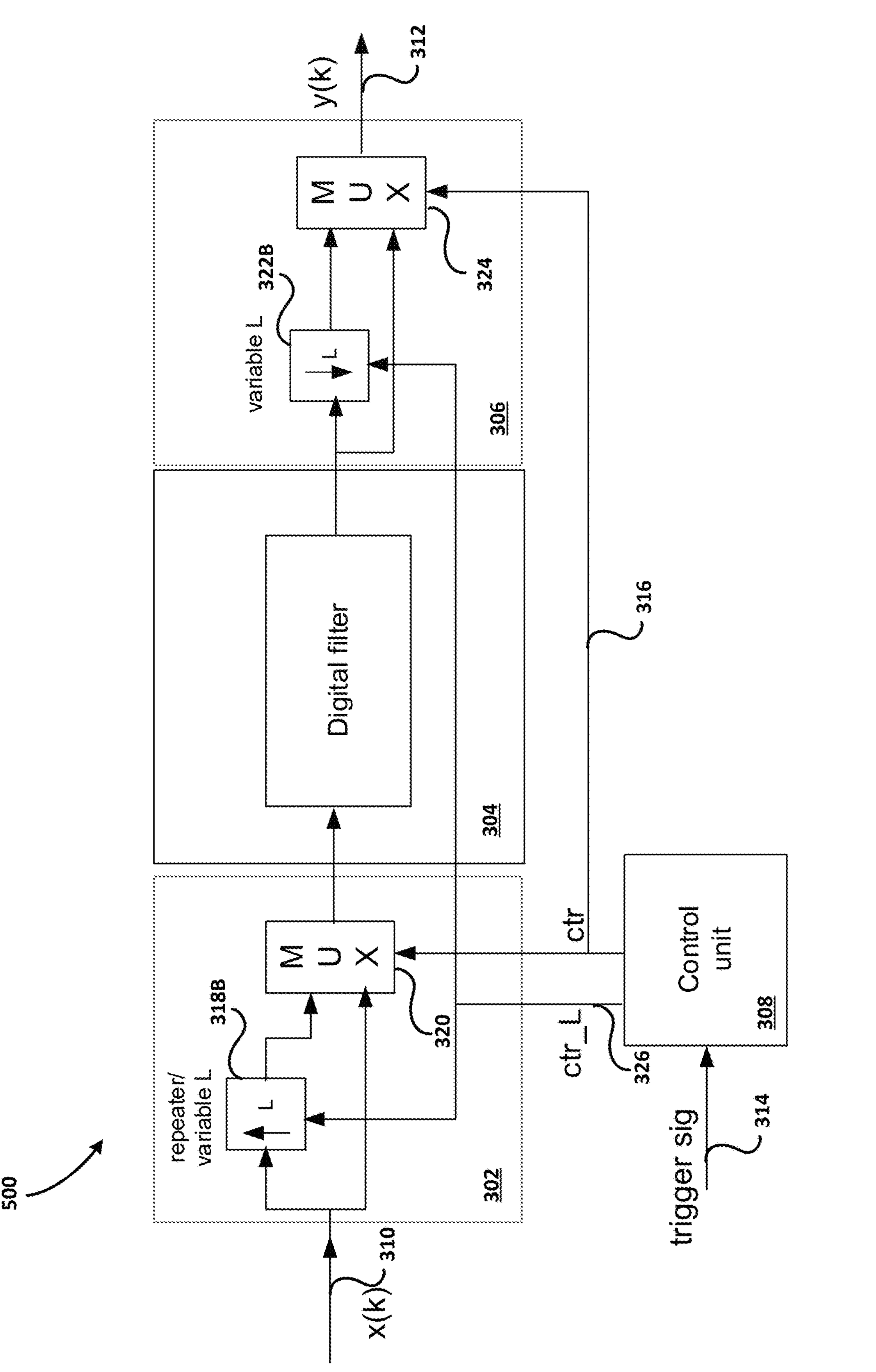

In FIG. 5 a variable interpolation/decimation alternative embodiment is shown for digital filter system 500. Digital filter system 500 includes a control unit 308 having a first output at node 316 for providing the "ctr" control signal as previously discussed, and a second output at node 326 for providing a "ctr_L" control signal for control the integer "L" for variable repeater 318B and for variable decimation component 322B. For example, when the "ctr_L" signal is in a first state, "L" can assume a first value, and the "ctr_L" signal is in a second state, "L" can assume a second value, wherein the first value and the second value are different values. In an embodiment, the first value of "L" can be higher than the second value, which means that digital filter 304 is filled even faster during an initial phase of the interpolation than in a subsequent phase of the interpolation.

Figure 6:
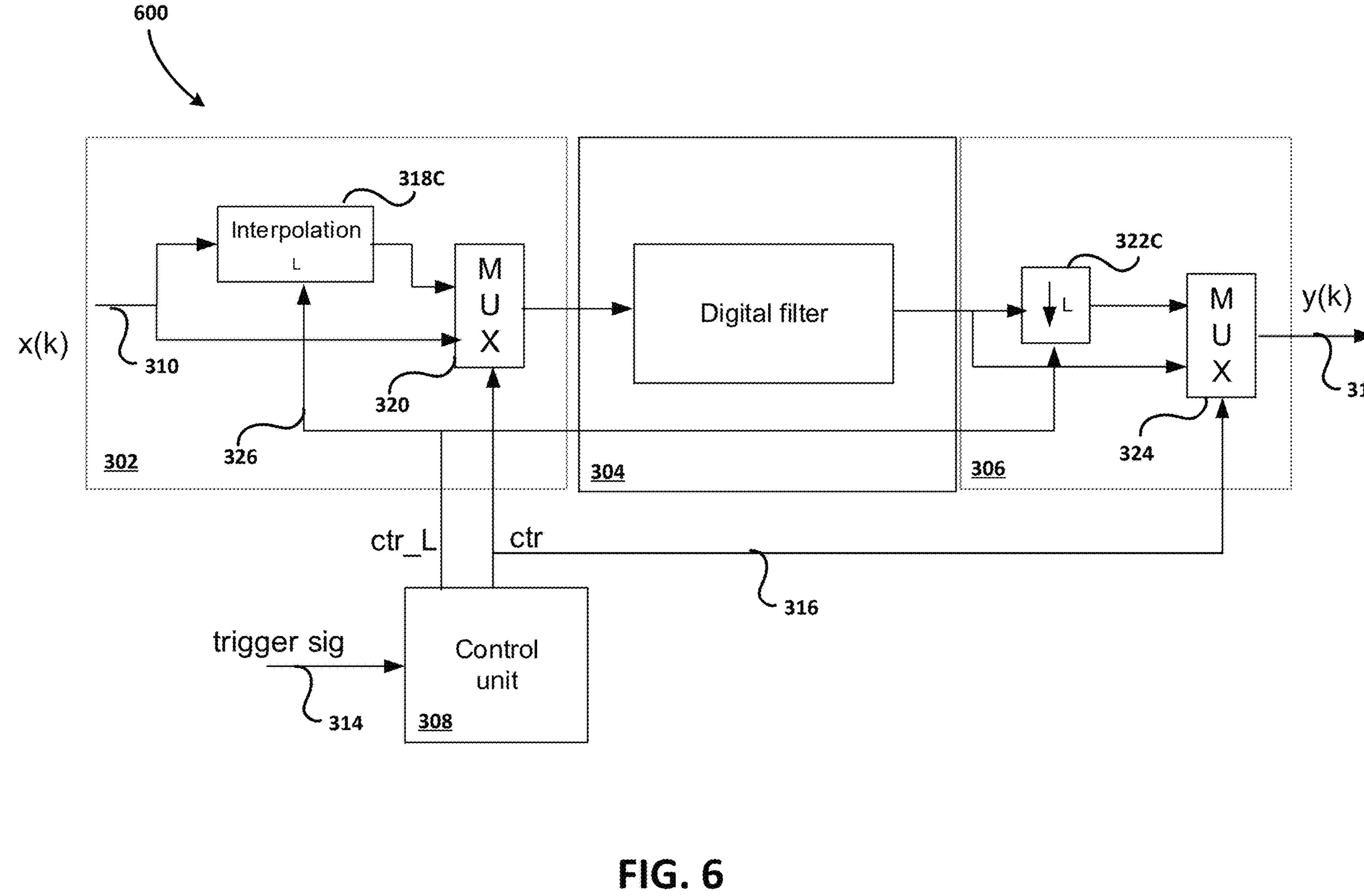

FIG. 6 shows a digital filter system 600 wherein interpolation component 318C is configured to provide a general interpolation component (higher order interpolation). Higher order interpolation can include polynomial interpolation, piecewise interpolation, "sinc" interpolation, as well as many other known interpolation techniques. Decimation component 322 is also configured to provide a general decimation component.

In the embodiments shown in FIG. 4, FIG. 5, and FIG. 6 the information of the input signal x(k) at node 310 is interpolated to fill digital filter 304 with "N"-samples during a switching transient when switching between modes of operation, and then the control unit 308 switches back to a "normal" operation mode after the switching transient wherein the interpolation is no longer used.

Figure 7:
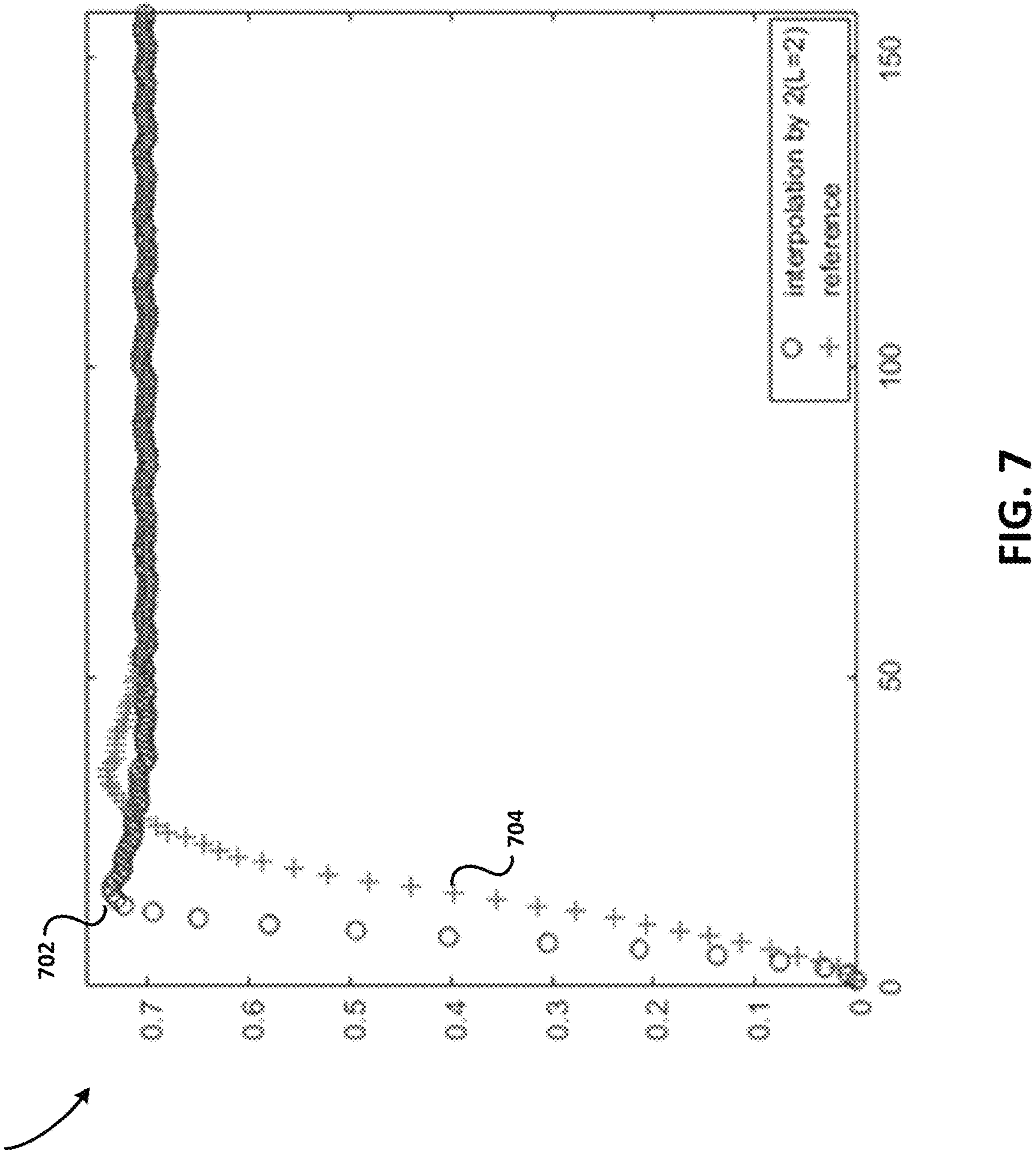
FIG. 7 is a simulated step response of a digital low-pass filter using the transient reduction circuitry according to an embodiment.

FIG. 7 is a simulated step response of a digital low-pass filter using the transient reduction circuitry according to an embodiment, and the simulated step response of a digital low-pass filter not using the transient reduction circuitry ("reference"). An interpolation of L=2 is used in the simulation. Graph 700 shows trace 704 associated with the digital low-pass filter not using the transient reduction circuitry, and trace 702 associated with the digital low-pass filter using the transient reduction circuitry, according to an embodiment. The x-axis units are sample numbers, and the y-axis units are arbitrary magnitude units. Note that in graph 700, trace 702 settles to the final value before trace 704. In other words, the transient response to a step function of a digital low pass filter is improved using the transient reduction circuitry (controlled interpolation and controlled decimation) when compared to a digital low pass filter not using the transient reduction circuitry.

Figure 8:
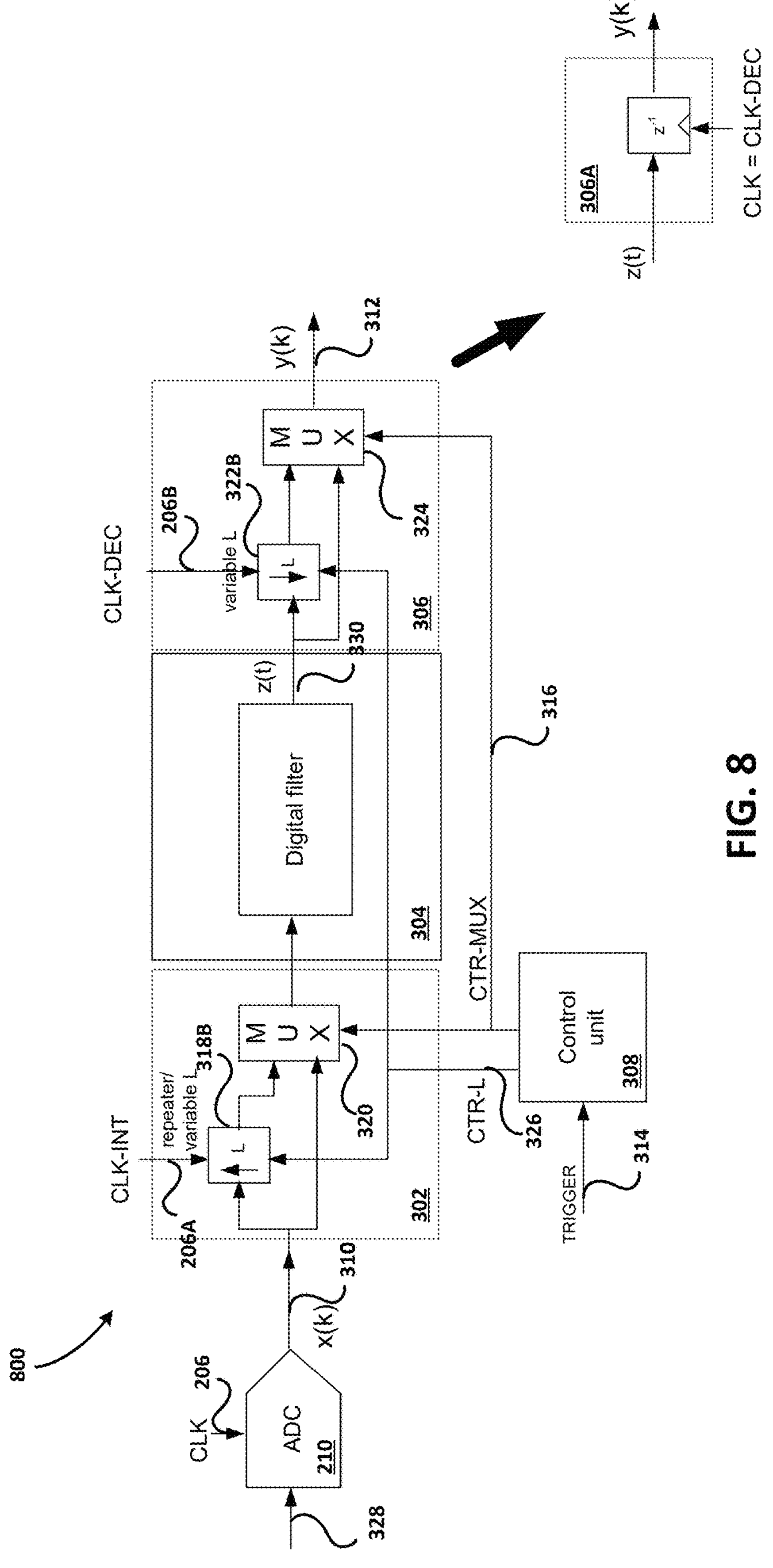
FIG. 8 is a block diagram of a digital filter with transient reduction circuitry, showing further detail related to showing clock signals and labeling of internal circuit nodes.

FIG. 8 is a block diagram of a digital filter system 800 with transient reduction circuitry, showing further detail related to showing clock signals and labeling of internal circuit nodes. Digital filter system 800 is substantially the same as digital filter system 500 shown in FIG. 5 except for the further details and labeled internal circuit nodes described below. In FIG. 8 ADC 210 is shown having an input at node 328 and at output x(k) at node 310. ADC 210 receives a CLK clock signal at node 206, variable repeater 318B receives a CLK-INT clock signal at node 206A, and variable decimation component 322B receives a CLK-DEC clock signal at node 206B. In FIG. 8, the output of digital filter 304 is labeled "z(t)" at node 330. In addition, an alternative decimation component 306A is shown in FIG. 8, which is a unit delay component shown in Z-transform notation, wherein a delay of one sample is used (L=2). Alternative decimation component 306A can be used in some embodiments instead of variable decimation component 322B. The operation of digital filter system 800 is simulated using all of the clock signals and labeled internal circuit nodes, and a corresponding timing diagram is shown in FIG. 9 and described below.

Figure 9:
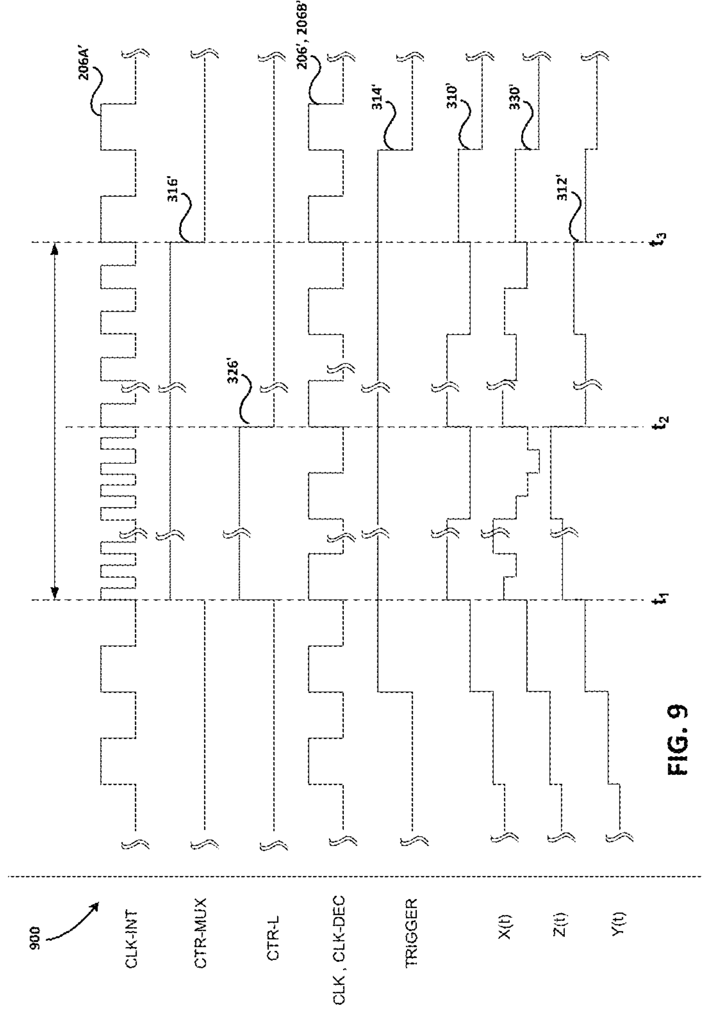
FIG. 9 is a timing diagram associated with the block diagram of FIG. 8.

FIG. 9 is a timing diagram 900 associated with the block diagram of FIG. 8. Various clock signals and internal node voltages are shown during three operational modes of a digital microphone, according to embodiments. The three optional modes includes a first operational mode, which can be either a low power mode (low SNR mode) or a high power mode (high SNR mode) that occurs before time $t_1$. A second operational mode is a transitional mode, wherein the controlled interpolation and controlled decimation occurs in response to a trigger signal. The transitional mode starts at time $t_1$, continues through time $t_2$, and ends at time $t_3$. A first sub-transitional mode starts at time t, and ends at time $t_2$. In a variable interpolation embodiment the first sub-transitional mode is associated with an interpolation performed at a first rate. A second sub-transitional mode starts at time $t_2$ and ends at time $t_3$. In the variable interpolation embodiment the second sub-transitional mode is associated with an interpolation performed at a second rate less than the first rate. The third operational mode, which can be either a low power mode (low SNR mode) or a high power mode (high SNR mode) occurs before time $t_3$.

The following waveforms are shown in FIG. 9: CLK-INT 206A' associated with node 206A; CTR-MUX 316' associated with node 316; CTR-L 326' associated with node 326; CLK 206' associated with node 206; CLK-DEC 206B' associated with node 206B; TRIGGER 314' associated with node 314; X(t) 310' associated with node 310; Z(t) 330' associated with node 330; and Y(t) 312' associated with node 312.

CLK-INT 206A' is shown in a relatively low clock rate in the first and third operational modes. During the first sub-transitional mode, CLK-INT 206A' is shown in a first relatively high clock rate, and during the second sub-transitional mode, CLK-INT 206A' is shown in a second relatively high clock rate less than the first relatively high clock rate. CTR-MUX 316' is shown as being low in the first and third operational modes and high in the transitional mode. CLK 206' and CLK-DEC 206B' are shown at the relatively low clock rate throughout all operational modes. (The output y[k] is always at the relatively low clock rate, and the decimation is implemented by the clocking of register 306A, in an embodiment.) The TRIGGER 314' signal is shown as low in the first mode of operation, but goes high during the first mode of operation, continues to be low in the transitional mode of operation, and goes low during the third mode of operation. X(t) 310', Z(t) 330', and Y(t) 312' are complex digital signals showing the effects of interpolation and decimation to the digital data.

Figure 10:
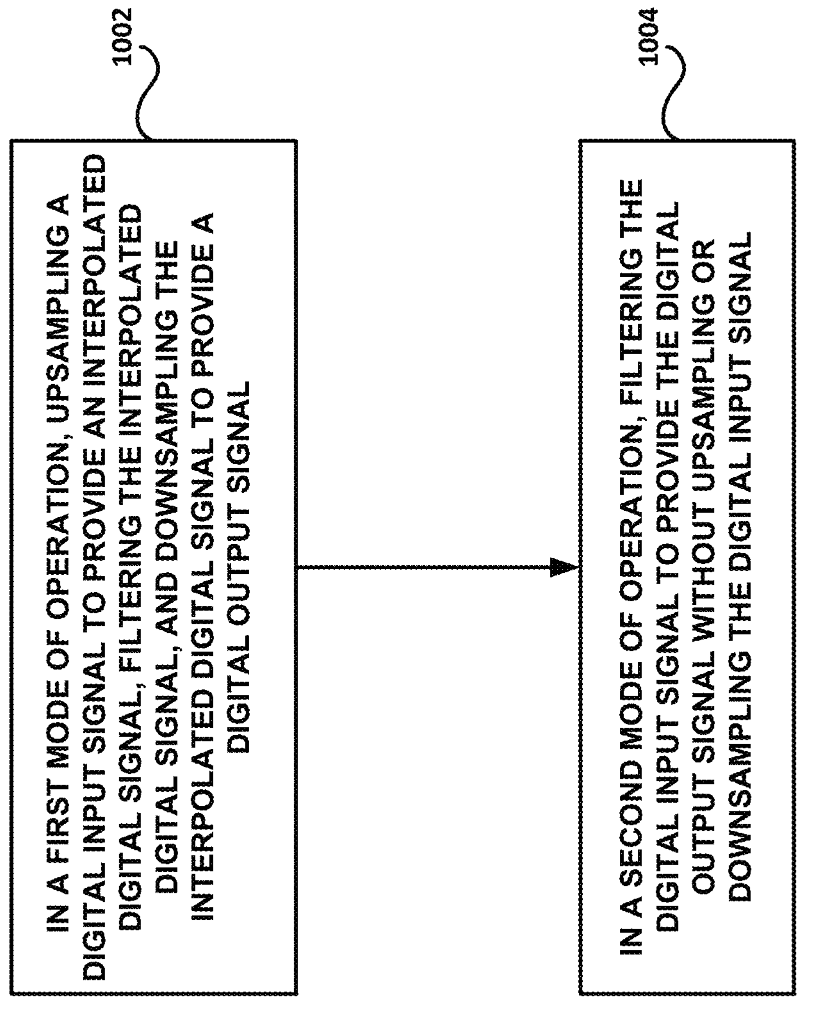
FIG. 10 is a flow chart of a digital filtering method for the reduction of transients in a digital microphone, according to an embodiment.

FIG. 10 is a flow chart of a digital filtering method 1000 for the reduction of transients in a digital microphone, according to an embodiment. The method comprises, in a first mode of operation, upsampling a digital input signal to provide an interpolated digital signal, filtering the interpolated digital signal, and downsampling the interpolated digital signal to provide a digital output signal at step 1002; and in a second mode of operation, filtering the digital input signal to provide the digital output signal without upsampling or downsampling the digital input signal at step 1004. In digital filtering method 1000, the second mode of operation comprises a low power operational mode or a high power operational mode and the first mode of operation is a transitional mode between the low power operational mode and the high power operational mode. In digital filter method

1000 upsampling the digital input signal comprises constant or variable upsampling, and downsampling the interpolated digital signal comprises constant or variable upsampling.

Figure 14:
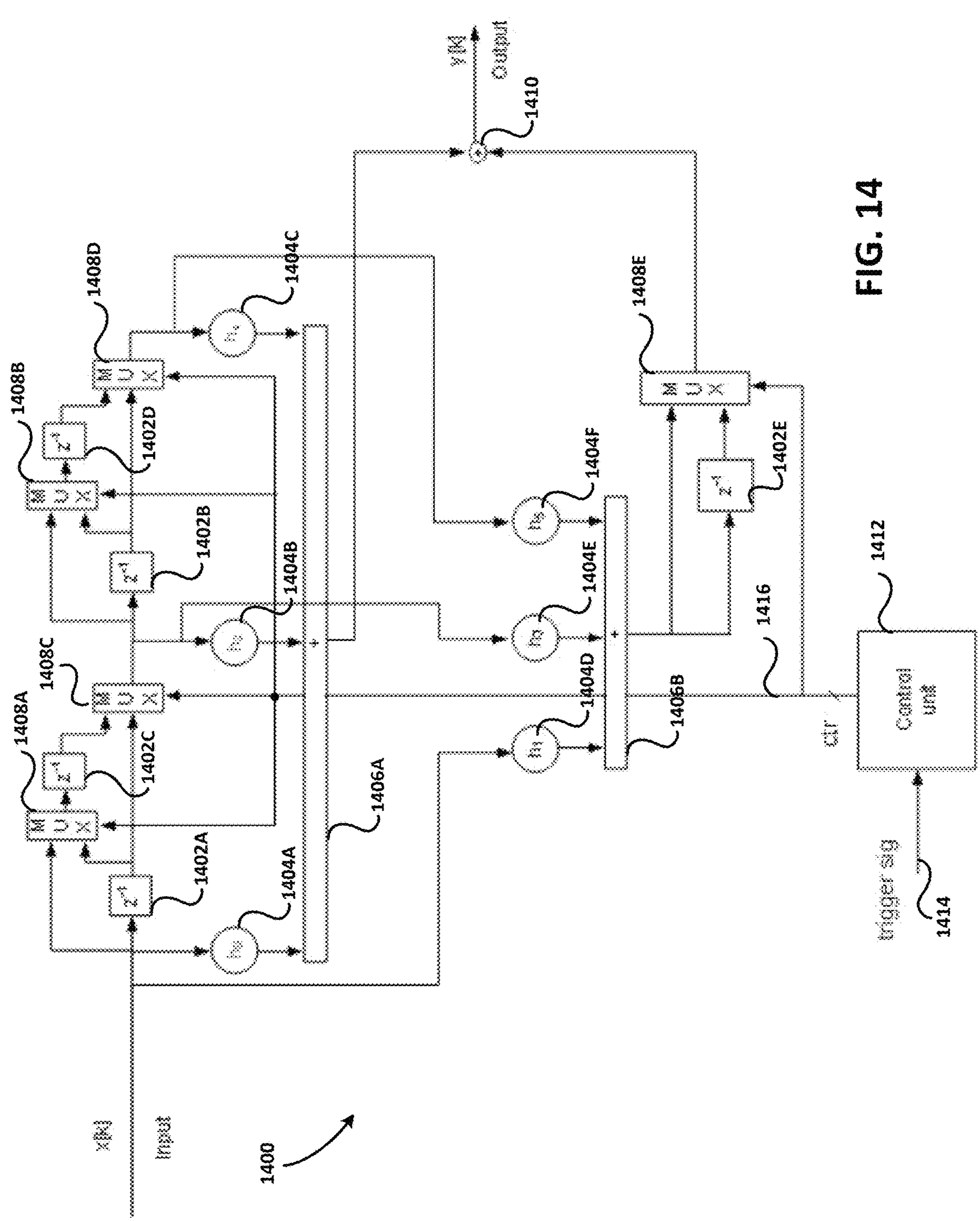
FIG. 14 is a schematic diagram of a switchable polyphase architecture for a finite impulse response (FIR) filter with minimized transients (L=2), according to an embodiment.
Figure 17:
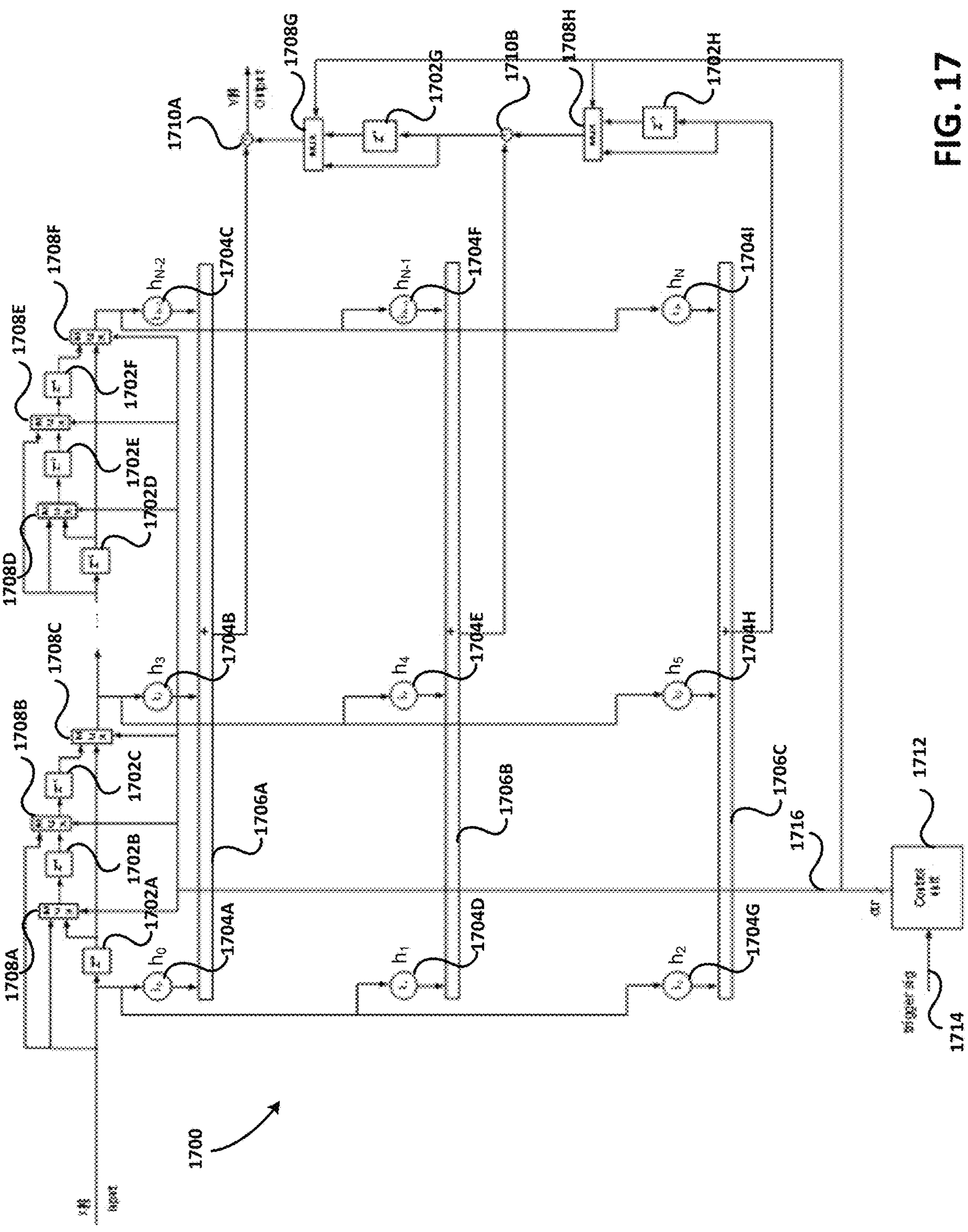
FIG. 17 is a schematic diagram of a switchable polyphase architecture for a finite impulse response (FIR) filter with minimized transients (L=3), according to an embodiment.

In another embodiment, a digital filter structure avoiding the need of an increased sampling frequency comprising a switchable FIR filter is shown in FIG. 14 and FIG. 17, and described in further detail below. The filter embodiments shown in FIG. 14 and FIG. 17 replace and are alternatives to the digital filter systems shown and described with respect to FIGS. 1-10. In the transient mode of operation the switchable FIR filter is switched to a polyphase FIR filter architecture, and in the low power or high power mode of operation the switchable FIR filter is switched to a standard FIR filter architecture. In an embodiment, the switchable polyphase FIR filter uses a modified polyphase architecture in order to minimize the number of registers used in the filter.

To minimize transients the digital filter system 400 of FIG. 4 operates for a limited time (based on the "ctr" control signal) with an L-times higher sampling frequency. The output signal of the digital filter system is decimated by L and based on the control signal the sampling frequency changes back to standard sampling frequency.

In an embodiment, an efficient switchable topology, which realizes the functionality shown in FIG. 4, is implemented based on a fifth order FIR filter, and shown in FIGS. 14 and 17, and described in detail below. The embodiments of FIGS. 14 and 17 advantageously do not require a higher sampling frequency.

Figure 11:
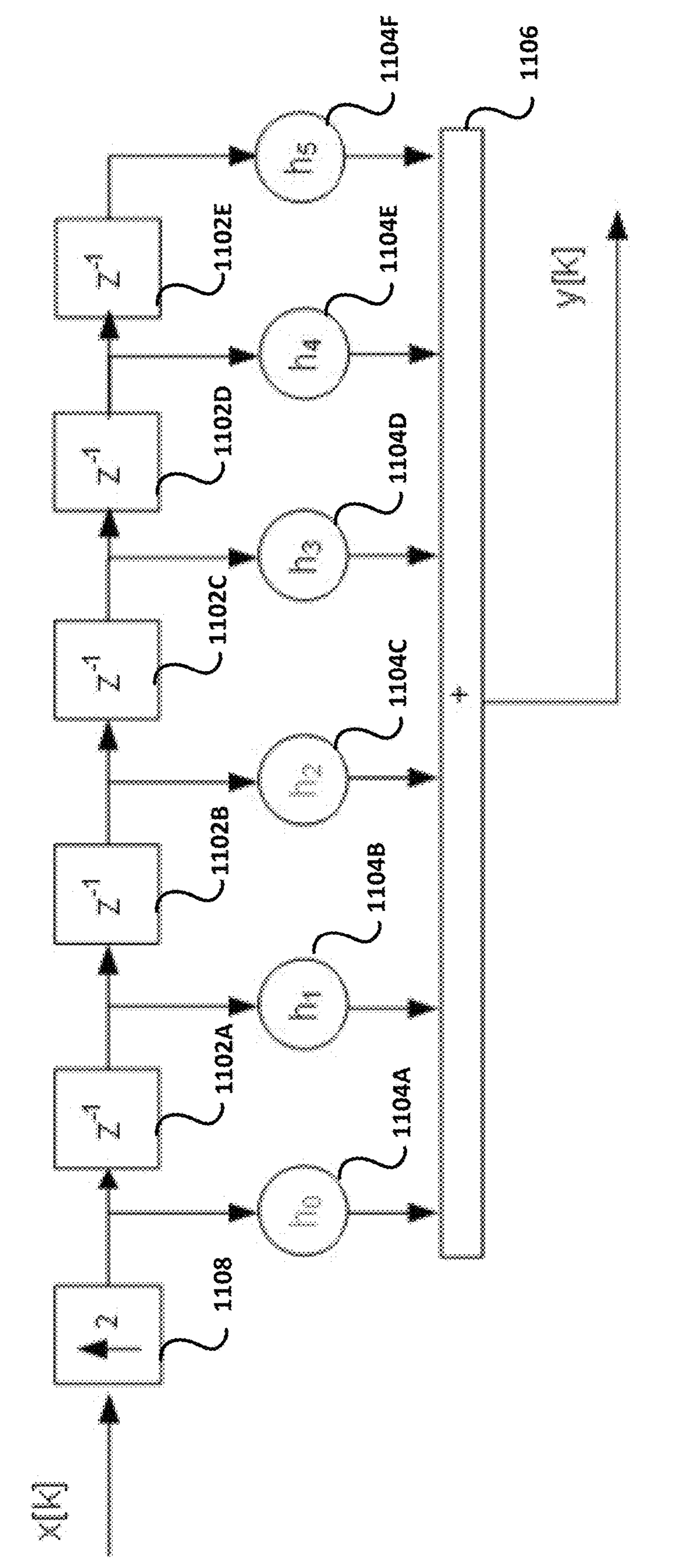
FIG. 11 is a schematic diagram of a standard filter topology for upsampling using a digital finite impulse response (FIR) filter (L=2)

An exemplary approach of interpolation (upsampling by a factor of L=2) is depicted in the standard FIR filter system 1100 shown in FIG. 11. Standard FIR filter system 1100 comprises a repeater 1108 coupled to input x[k], a plurality of unit delay components 1102A, 1102B, 1102C, 1102D, and 1102E shown in Z-transform notation. The plurality of unit delay components are coupled to a plurality of multipliers 1104A ($h_0$), 1104B ($h_1$), 1104C ($h_2$), 1104D ($h_3$), 1104E ($h_4$), and 1104F ($h_5$). The output of each of the multipliers is the product of the input and the coefficient written inside the multiplier. The multipliers are coupled to a summer 1106, whose output y[k] is the sum of all of its inputs.

To avoid the higher sampling frequency for the digital FIR filter, however, a polyphase topology of digital FIR filter system 1200, shown in FIG. 6, is typically used. Digital FIR filter system 1200 includes a first filter portion that includes unit delay components 1202A and 1202B, multipliers 1204A ($h_0$), 1204B ($h_2$), and 1204C ($h_4$), and summer 1206A. Digital FIR filter system 1200 includes a second filter portion that includes unit delay components 1202C and 1202D, multipliers 1204D ($h_1$), 1204E ($h_3$), and 1204F ($h_5$), and summer 1206B. The output of summer 1206A is coupled to repeater 1208A, and the output of summer 1206B is coupled to repeater 1208B. The output of repeater 1208A is coupled to summer 1210, and the output of repeater 1208B is coupled through unit delay component 1202E to summer 1210. The output of summer 1210 is the output y[k] of digital FIR filter system 1200.

Figure 12:
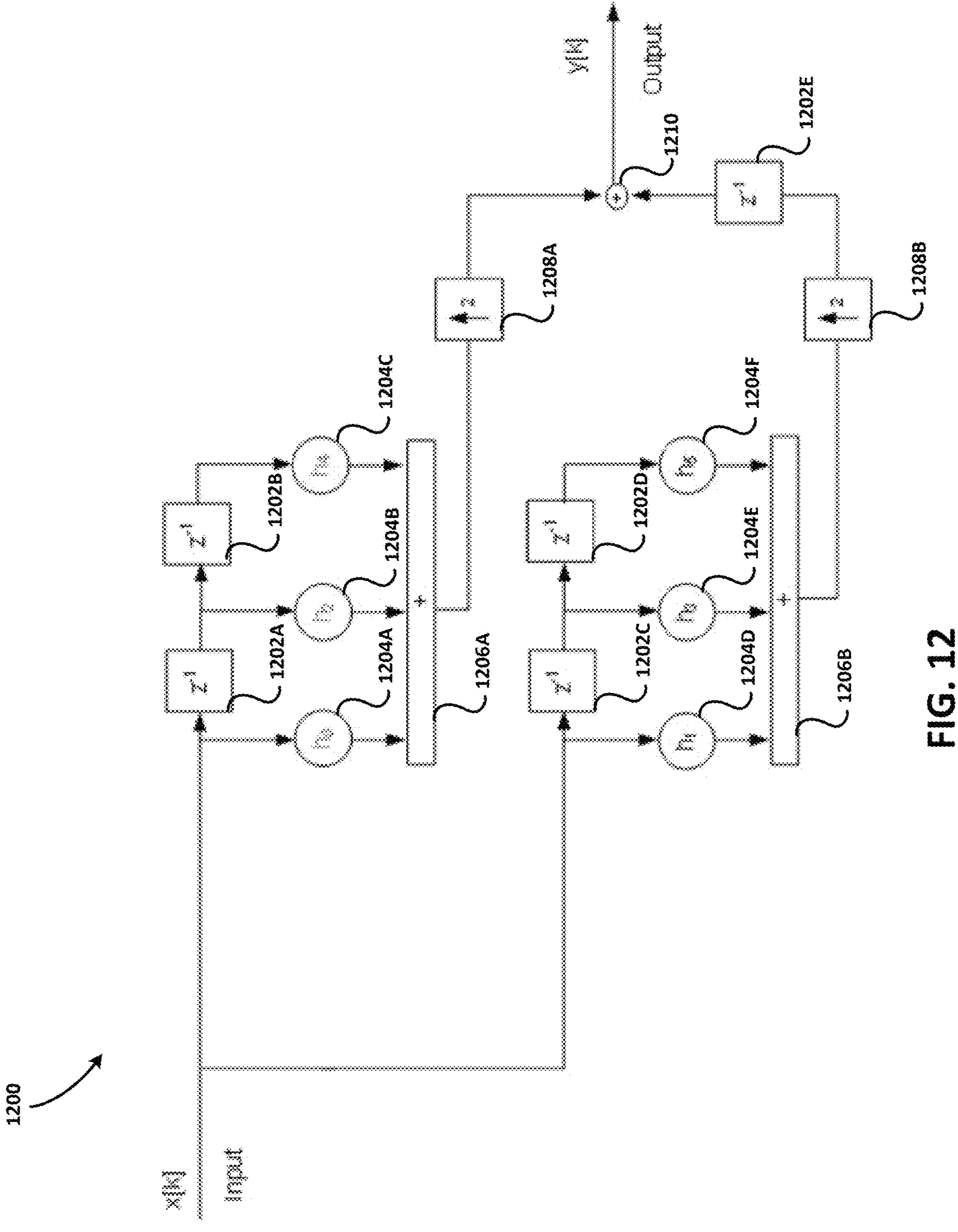
FIG. 12 is a schematic diagram of a polyphase filter topology for upsampling using a digital finite impulse response (FIR) filter (L=2)
Figure 13:
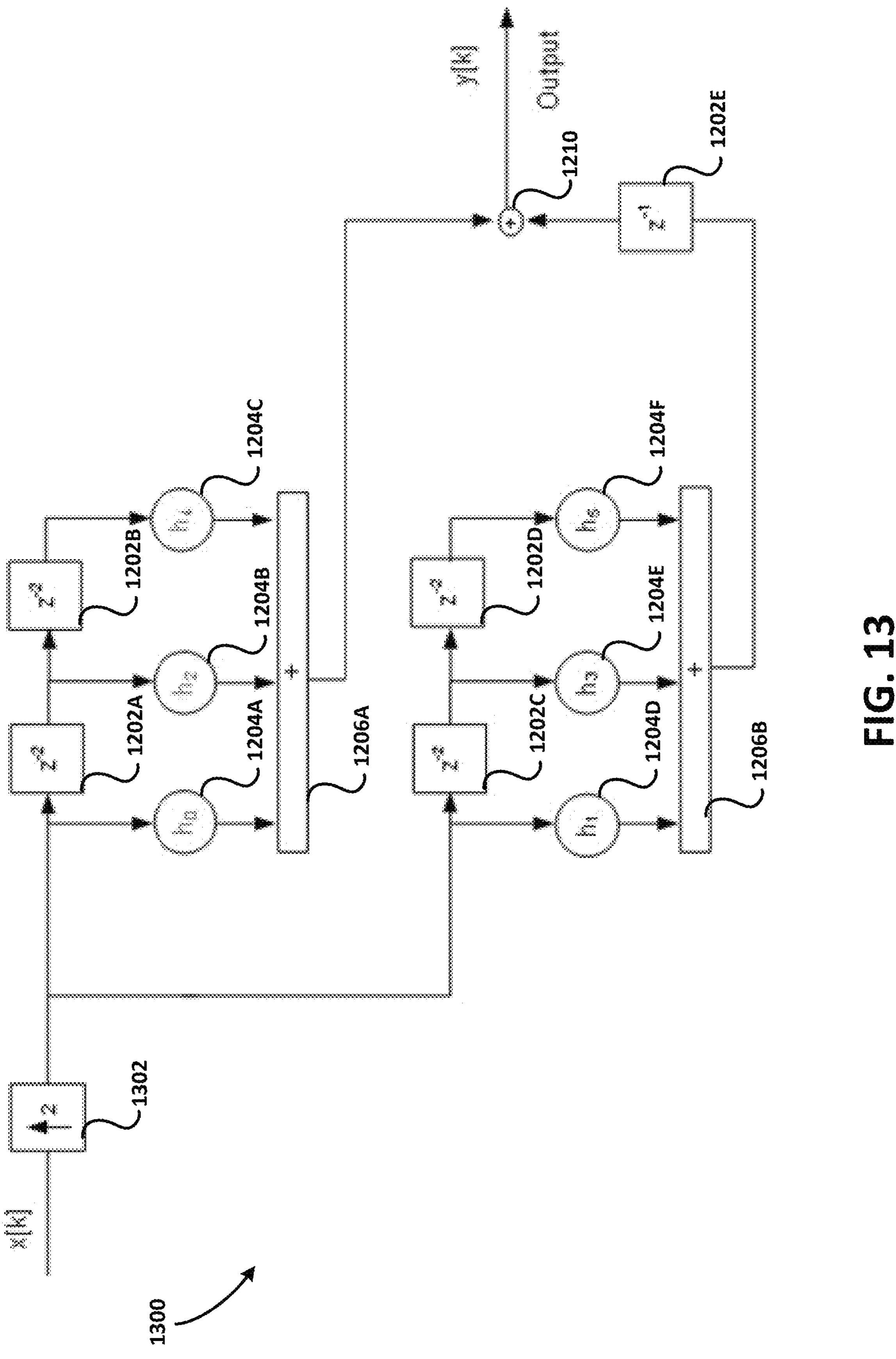
FIG. 13 is a schematic diagram of a polyphase filter topology operating at a high sampling rate.

In FIG. 13 a polyphase topology operating on a high sampling rate is shown in digital FIR filter system 1300. Digital FIR filter system 1300 uses the same unit delay components, multipliers, and summers as is shown for digital FIR filter system 1200 shown in FIG. 12. However, repeaters 1208A and 1208B are not used. Instead, a repeater 1302 is interposed between input x[k] and the input to the first and second filter portions.

One potential disadvantage of digital FIR filter system 1300 compared to the standard FIR filter system 1100 is that the number of needed registers is doubled and therefore relatively inefficient.

FIG. 14 shows an efficient switchable architecture of switchable FIR filter 1400, which realizes the functionality of FIG. 4 avoiding a higher sampling frequency with a minimum of registers. For the implementation of the functionality shown in FIG. 4, according to an embodiment, switchable FIR filter 1400 advantageously and efficiently switches between the polyphase topology and the standard FIR filter implementation, thus avoiding the use of a higher clock frequency.

Switchable FIR filter 1400 includes a delay and multiplexer circuit including unit delay components (or registers) 1402A, 1402B, 1402C, and 1402D, and multiplexers 1408A, 1408B, 1408C, and 1408D. The inputs of multiplexer 1408A, are coupled between the input and output of unit delay component 1402A. The inputs of multiplexer 1408B are coupled between the input and output of unit delay component 1402B. The inputs of multiplexer 1408C are coupled to the outputs of unit delay component 1402A and unit delay component 1402C. The inputs of multiplexer 1408D are coupled to the output of unit delay component 1402B and unit delay component 1402D.

A first filter portion of switchable FIR filter 1400 includes multipliers 1404A ($h_0$), 1404B ($h_2$), and 1404C ($h_4$), and summer 1406A. Multiplier 1404A is coupled between unit delay component 1402A and summer 1406A, multiplier 1404B is coupled between unit delay component 1402B and summer 1406A, and multiplier 1404C is coupled between multiplexer 1408D and summer 1406A. A second filter portion of switchable FIR filter 1400 includes multipliers 1404D ($h_1$), 1404E ($h_3$), and 1404F ($h_5$), and summer 1406B. Multiplier 1404D is coupled between unit delay component 1402A and summer 1406B, multiplier 1404E is coupled between unit delay component 1402B and summer 1406B, and multiplier 1404F is coupled between multiplexer 1408D and summer 1406B.

Switchable FIR filter 1400 also includes a unit delay component 1402E, a multiplexer 1408E, summer 1410, and control unit 1412. The input of control unit 1412 receives the trigger signal at node 1414, and provides the "ctr" control signal at node 1416. A control input of multiplexers 1408A, 1408B, 1408C, 1408D, and 1408E are coupled to node 1416 for receiving the trigger signal. The output of summer 1406A is coupled to a first input of summer 1410, and the output of multiplexer 1408E is coupled to a second input of summer 1410. The output of summer 1410 is the output y[k] of switchable FIR filter 1400. The output of summer 1406B is directly coupled to a first input of multiplexer 1408E, and indirectly coupled to a second input of multiplexer 1408E through unit delay component 1402E.

In the fast transient mode (L=2) half of the registers of switchable FIR filter 1400 are bypassed but preloaded accordingly. In the fast transient mode multiplexer 1408C takes the output of register 1402A (so register 1402C is bypassed) and multiplexer 1408A takes the input signal [x] and preloads register 1402C. This is valid also for registers 1402D and 1402E. In the normal mode of operation (low power mode or high power mode) the preloaded register are switched in and this configuration represents then the functionality of a FIR filter. In other words, in the fast transient mode, the following components are bypassed: registers 1402C, 1402D, and 1402E. In this manner a polyphase FIR filter architecture is provided. In the normal mode of operation, none of these registers are bypassed. In this manner a standard FIR filter architecture is provided.

Switchable FIR filter 1400 advantageously provides a topology that reduces transients of digital FIR filters yet avoiding higher sampling frequencies. This, in turn, advantageously results in a relatively low power consumption, because a clock tree of a corresponding digital microphone can be designed based on a single reduced frequency clock signal.

In FIG. 14 a switchable FIR filter architecture was described for an interpolation factor of L=2. The switchable FIR filter architecture can be generalized to include other interpolation factors, for example an interpolation factor of L=3. Other higher interpolation factors can also be used, for example L=4 or L=5, or even larger interpolation factors if desired.

Figure 15:
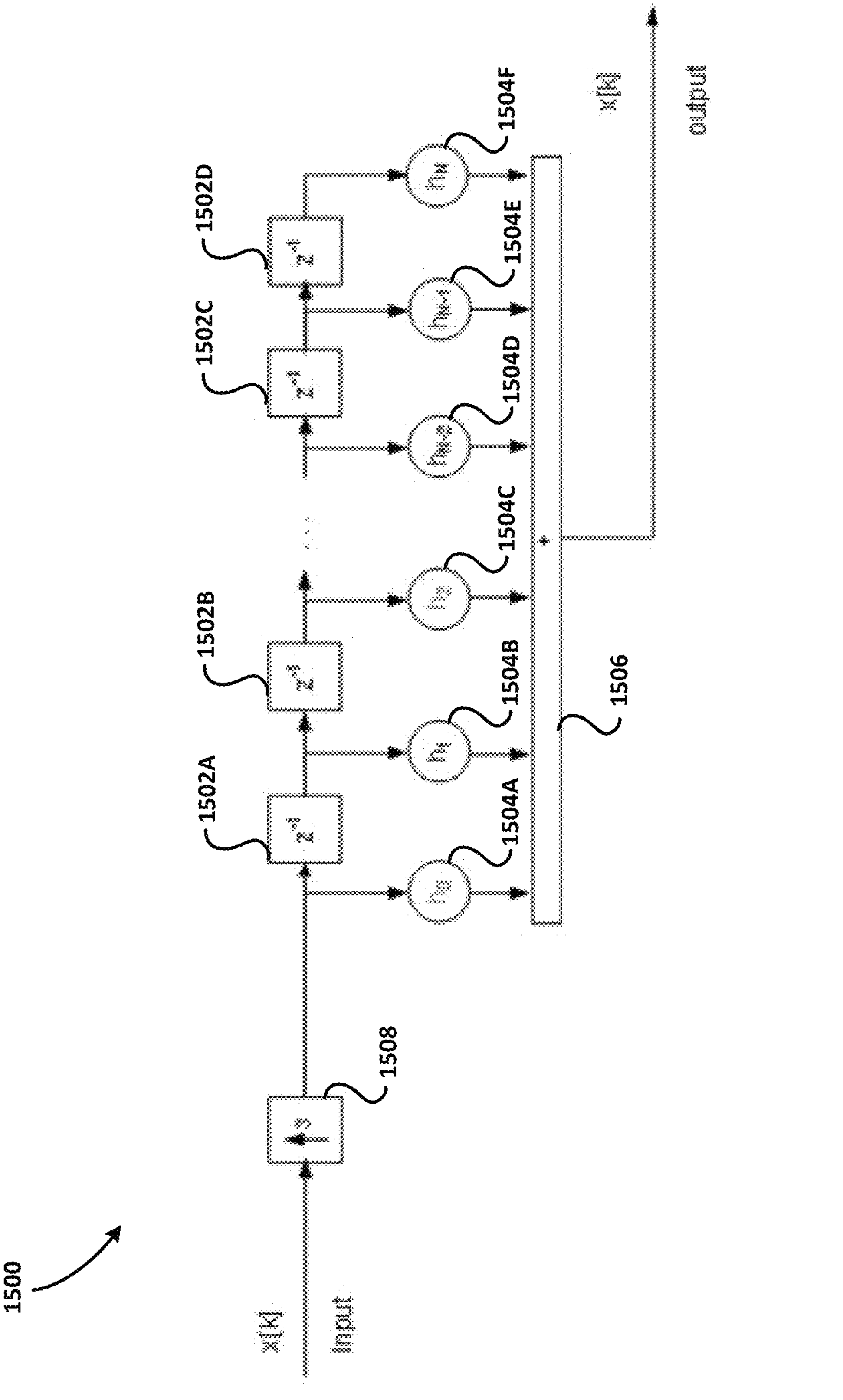
FIG. 15 is a schematic diagram of a standard filter topology for upsampling using a digital finite impulse response (FIR) filter (L=3)

FIG. 15 is a schematic diagram of a standard filter topology for upsampling using a general digital finite impulse response (FIR) filter system 1500 (L=3). The general digital FIR filter system 1500 is a standard implementation of the functionality shown in FIG. 4. The general digital FIR filter system 1500 comprises an interpolation component 1508 having an interpolation factor of L=3 for receiving the digital input signal x[k]. The interpolation component 1508 is couple to a standard topology digital filter comprising unit delay components 1502A, 1502B, . . . , 1502C, and 1502D, multipliers 1504A ($h_0$), 1504B ($h_1$), 1504C ($h_2$), 1504D ($h_{N-2}$), 1504E ($h_{N-1}$), and 1504F ($h_N$), and summer 1506 for providing a digital output signal y[k].

Figure 16:
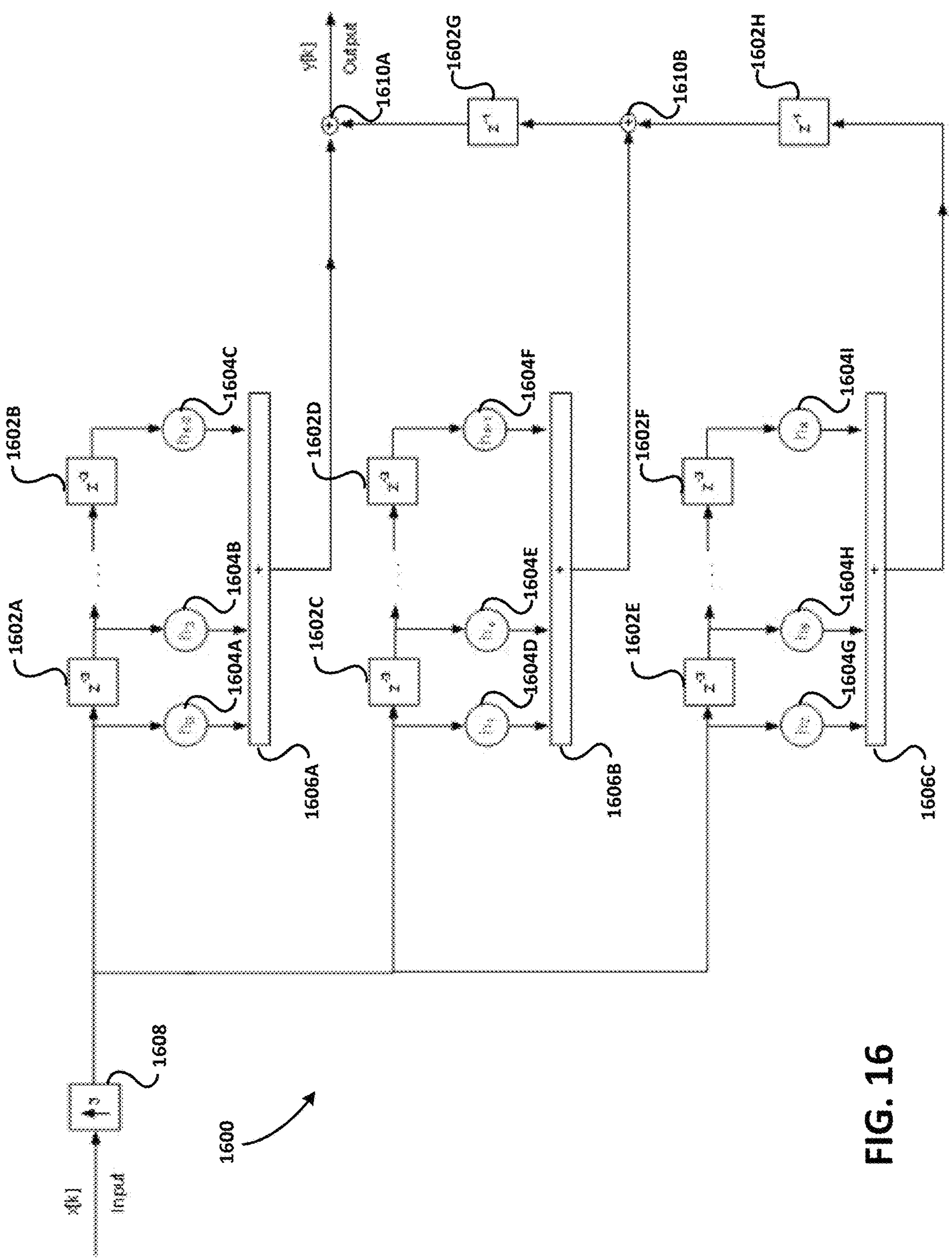
FIG. 16 is a schematic diagram of a polyphase filter topology operating at a high sampling rate (L=3)

FIG. 16 is a schematic diagram of polyphase FIR filter 1600 having a polyphase FIR filter topology operating at a high sampling rate (L=3). Polyphase FIR filter 1600 is an intermediate implementation operating on a high sampling frequency, and a switchable FIR filter topology shown in FIG. 17. Polyphase FIR filter 1600 comprises three branches and three delays between the coefficients. These two parameters (number of branches and number of delays between the coefficients) are in general defined by the interpolation factor L=3. The first branch comprises unit delays 1602A, . . . , 1602B, multipliers 1604A ($h_0$), 1604B ($h_3$), and 1604A ($h_{N-2}$), and summer 1606A. The second branch comprises unit delays 1602C, . . . , 1602D, multipliers 1604D ($h_1$), 1604E ($h_4$), and 1604F ($h_{N-1}$), and summer 1606B. The third branch comprises unit delays 1602E, . . . , 1602F, multipliers 1604G ($h_2$), 1604H ($h_5$), and 1604I ($h_N$), and summer 1606C. The output of summer 1606A is coupled to summer 1610A, which in turn provides the digital output signal y[k]. The output of summer 1606B is coupled to summer 1610B, which in turn is coupled to summer 1610A through unit delay component 1602G. The output of summer 1606C is coupled to unit delay component 1602H, which in turn is coupled to summer 1610B.

FIG. 17 is a schematic diagram of a switchable polyphase architecture for a finite impulse response (FIR) filter with minimized transients (L=3), according to an embodiment. The switchable FIR filter 1700 shown in FIG. 17 comprises a multiplexer and delay circuit coupled to three filter branches. In a transient mode of operation, switchable FIR filter 1700 emulates a polyphase FIR filter topology without the necessity of using a relatively high clock frequency. In a normal mode of operation, switchable FIR filter 1700 emulates a standard FIR filter topology. A control unit 1712 is used, which in response to a trigger signal at node 1714, generates a "ctr" control signal that changes of the state in the multiplexers in the multiplexer and delay circuit. The state of the multiplexers then determines the particular topology of switchable FIR filter 1700.

The multiplexer and delay circuit comprises unit delay components (or registers) 1702A, 1702B, and 1702C, coupled to multiplexers 1708A, 1708B, and 1708C. Each of the multiplexers receive the "ctr" control signal at a control input of the multiplexer. The sub-circuit of unit delay components 1702A, 1702B, and 1702C and multiplexers 1708A, 1708B, and 1708C is repeated as required by the interpolation factor of the filter. For example, in switchable FIR filter 1700, the multiplexer and delay sub-circuit is repeated once and comprises unit delay components 1702D, 1702E, and 1702F, coupled to multiplexers 1708D, 1708E, and 1708F.

Switchable FIR filter 1700 comprises a first filter branch including multipliers 1704A ($h_0$), 1704B ($h_3$), and 1704C ($h_{N-2}$), and summer 1706A. Summer 1706A is coupled to summer 1710A. A second filter branch includes multipliers 1704D ($h_1$), 1704E ($h_4$), and 1704F ($h_{N-1}$), and summer 1706B. Summer 1706B is coupled to summer 1710B. A third filter branch includes multipliers 1704G ($h_2$), 1704H ($h_5$), and 1704I ($h_N$), and summer 1706C. Summer 1706B is coupled to multiplexer 1708H and unit delay component 1702H. In an embodiment, the output of summer 1710A provides the y[k] digital output signal. Summers 1710A and 1710B are coupled together through multiplexer 1708G and unit delay component 1702G. Summer 1710B and summer 1706C are coupled together through multiplexer 1708H and unit delay component 1702H.

In the transient mode of operation, switchable FIR filter 1700 emulates a standard FIR filter topology, and no registers are bypassed. In the normal mode of operation (low power mode or high power mode), switchable FIR filter 1700 emulates a polyphase FIR filter topology and the following registers are bypassed: 1702B, 1702C, 1702E, 1702F, 1702G, and 1702H.

In summary, FIGS. 14 and 17 show embodiments of a switchable FIR filter topology that advantageously does not require a high clock frequency during the transient mode of operation, yet provides all of the transient reducing functionality of the audible transient reduction circuit shown in FIG. 4. In addition, the number of registers can be reduced when compared to a full polyphase filter topology such that power can also be reduced. The clock tree of a digital microphone incorporating the switchable FIR filter topology can also be simplified.

Example embodiments of the present invention are summarized here. Other embodiments can also be understood from the entirety of the specification and the claims filed herein.

Example 1. According to an embodiment, a digital microphone comprises a logarithmic amplifier; an analog-to-digital converter (ADC) coupled to the logarithmic amplifier; a digital decompression component coupled to the ADC; and a digital filter coupled to the digital decompression component, wherein the digital filter comprises a controlled upsampling component coupled to an input of the digital filter and a controlled downsampling component coupled to an output of the digital filter.

Example 2. The digital microphone of Example 1, further comprising a controller having an input configured for receiving a trigger signal and having a first output.

Example 3. The digital microphone of any of the above examples, wherein the upsampling component comprises a multiplexer having a control input coupled to the first output of the controller.

Example 4. The digital microphone of any of the above examples, wherein the downsampling component comprises a multiplexer having a control input coupled to the first output of the controller.

Example 5. The digital microphone of any of the above examples, wherein the controller further comprises a second output.

Example 6. The digital microphone of any of the above examples, wherein the upsampling component comprises a repeater having a control input coupled to the second output of the controller.

Example 7. The digital microphone of any of the above examples, wherein the downsampling component comprises a decimation component having a control input coupled to the second output of the controller.

Example 8. The digital microphone of any of the above examples, wherein the upsampling component comprises a constant interpolation repeater, a variable interpolation repeater, or a general interpolation component.

Example 9. The digital microphone of any of the above examples, wherein the downsampling component comprises a constant decimation component, a variable decimation component, or a general decimation component.

Example 10. The digital microphone of any of the above examples, wherein the ADC comprises a sigma-delta converter.

Example 11. According to an embodiment, a digital filter system comprises a controlled upsampling component coupled to an input of the digital filter; a digital filter having an input coupled to an output of the controlled upsampling component; a controlled downsampling component coupled to an output of the digital filter; and a controller having a trigger signal input and a first output coupled to a first control input of the controlled upsampling component and coupled to a first control input of the controlled downsampling component.

Example 12. The digital filter system of Example 11, wherein the controller further comprises a second output coupled to a second control input of the controlled upsampling component and coupled to a second control input of the controlled downsampling component.

Example 13. The digital filter system of any of the above examples, wherein the upsampling component comprises a constant interpolation repeater, a variable interpolation repeater, or a general interpolation component.

Example 14. The digital microphone of any of the above examples, wherein the downsampling component comprises a constant decimation component, a variable decimation component, or a general decimation component.

Example 15. The digital microphone of any of the above examples, wherein at least one of the upsampling component and the downsampling component comprises a multiplexer.

Example 16. According to an embodiment, a method comprises in a first mode of operation, upsampling a digital input signal to provide an interpolated digital signal, filtering the interpolated digital signal, and downsampling the interpolated digital signal to provide a digital output signal; and in a second mode of operation, filtering the digital input signal to provide the digital output signal without upsampling or downsampling the digital input signal.

Example 17. The method of Example 16, wherein the second mode of operation comprises a low power operational mode or a high power operational mode.

Example 18. The method of any of the above examples, wherein the first mode of operation is a transitional mode between the low power operational mode and the high power operational mode.

Example 19. The method of any of the above examples, wherein upsampling the digital input signal comprises constant or variable upsampling.

Example 20. The method of any of the above examples, wherein downsampling the interpolated digital signal comprises constant or variable upsampling.

Example 21. According to an embodiment, a digital filter system comprises a switchable FIR filter that is configured for switching between a standard FIR filter architecture and a polyphase FIR filter architecture.

Example 22. The digital filter system of Example 21, wherein the FIR filter comprises a multiplexer switching circuit.

Example 23. A digital filtering method for a digital microphone, the method comprising switching between a standard FIR filter architecture in a first mode of operation of the digital microphone and a polyphase FIR filter architecture in a second mode of operation of the digital microphone.

Example 24. The digital filtering method of Example 23, wherein the FIR filter comprises a multiplexer switching circuit for switching between the first mode of operation and the second mode of operation.

Example 25. The digital filtering method of any of the above examples, wherein the multiplexer switching circuit comprises a plurality of multiplexers, and wherein each of the plurality of multiplexers comprises a control input for receiving a control signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:

a logarithmic amplifier;

an analog-to-digital converter (ADC) coupled to the logarithmic amplifier;

a digital decompression component coupled to the ADC; and a digital filter coupled to the digital decompression component, wherein the digital filter comprises a controlled upsampling component coupled to an input of the digital filter and a controlled downsampling component coupled to an output of the digital filter.

2. The digital microphone of claim 1, further comprising a controller having an input configured for receiving a trigger signal and having a first output.

3. The digital microphone of claim 2, wherein the upsampling component comprises a multiplexer having a control input coupled to the first output of the controller.

4. The digital microphone of claim 2, wherein the downsampling component comprises a multiplexer having a control input coupled to the first output of the controller.

5. The digital microphone of claim 2, wherein the controller further comprises a second output.

6. The digital microphone of claim 5, wherein the upsampling component comprises a repeater having a control input coupled to the second output of the controller.

7. The digital microphone of claim 5, wherein the down-sampling component comprises a decimation component having a control input coupled to the second output of the controller.

8. The digital microphone of claim 1, wherein the upsampling component comprises a constant interpolation repeater, a variable interpolation repeater, or a general interpolation component.

9. The digital microphone of claim 1, wherein the down-sampling component comprises a constant decimation component, a variable decimation component, or a general decimation component.

10. The digital microphone of claim 1, wherein the ADC comprises a sigma-delta converter.

* * * * *